United States Patent
Li et al.

(10) Patent No.: US 12,113,503 B2
(45) Date of Patent: Oct. 8, 2024

(54) MANUFACTURING PROCESS FOR BULK ACOUSTIC RESONATOR, AND BULK ACOUSTIC RESONATOR

(71) Applicant: HANGZHOU XINGHE TECHNOLOGY CO., LTD., Zhejiang (CN)

(72) Inventors: Linping Li, Zhejiang (CN); Jinghao Sheng, Zhejiang (CN); Zhou Jiang, Zhejiang (CN)

(73) Assignee: HANGZHOU XINGHE TECHNOLOGY CO., LTD. (CN)

( * ) Notice: Subject to any disclaimer, the term of this patent is extended or adjusted under 35 U.S.C. 154(b) by 0 days.

(21) Appl. No.: 18/028,122

(22) PCT Filed: Sep. 27, 2020

(86) PCT No.: PCT/CN2020/118175
§ 371 (c)(1),
(2) Date: Mar. 23, 2023

(87) PCT Pub. No.: WO2022/061835
PCT Pub. Date: Mar. 31, 2022

(65) Prior Publication Data
US 2023/0327627 A1    Oct. 12, 2023

(30) Foreign Application Priority Data

Sep. 25, 2020  (CN) .......................... 202011024256.8

(51) Int. Cl.
*H03H 3/02*    (2006.01)
*H03H 9/02*    (2006.01)
*H03H 9/17*    (2006.01)

(52) U.S. Cl.
CPC .......... *H03H 3/02* (2013.01); *H03H 9/02125* (2013.01); *H03H 9/175* (2013.01); *H03H 2003/025* (2013.01)

(58) Field of Classification Search
CPC ...... H03H 3/02; H03H 9/02125; H03H 9/175; H03H 2003/025; H03H 2003/021;
(Continued)

(56) References Cited

U.S. PATENT DOCUMENTS

| 10,790,797 B2 | 9/2020 | Han et al. |
| 2010/0025852 A1 | 2/2010 | Ueki et al. |

(Continued)

FOREIGN PATENT DOCUMENTS

| CN | 102347746 A | 2/2012 |
| CN | 102916674 A | 2/2013 |

(Continued)

OTHER PUBLICATIONS

Abdulrahman Alsolami et al. "Improvement of Deep Reactive Ion Etching Process for Motional Resistance Reduction of Capacitively Transduced Vibrating Resonators" vol. 2, No. 1, Mar. 2018, Publisher: IEEE Sensors Letters, Date of publication Jan. 23, 2018, pp. 1-4.

(Continued)

*Primary Examiner* — Andrea Lindgren Baltzell
*Assistant Examiner* — Kimberly E Glenn
(74) *Attorney, Agent, or Firm* — The Belles Group, P.C.

(57) ABSTRACT

A manufacturing process for a bulk acoustic resonator, comprising: making an acoustic mirror on a substrate; making a bottom electrode layer for covering the acoustic mirror on the substrate; performing chemical treatment on a peripheral part of the bottom electrode layer to form a modified layer, which surrounds the bottom electrode layer; making a piezoelectric layer on the bottom electrode layer;

(Continued)

and making a top electrode layer on the piezoelectric layer. A bulk acoustic resonator, comprising: a substrate, an acoustic mirror formed on the substrate, and a bottom electrode layer, a piezoelectric layer and a top electrode layer that are sequentially formed on the substrate with the acoustic mirror, chemical treatment is performed on a part of the bottom electrode layer close to an edge of the acoustic mirror to form a modified layer. Parasitic oscillation of the resonator is inhibited, and wiring of a top electrode is greatly simplified.

13 Claims, 6 Drawing Sheets

(58) Field of Classification Search
CPC ......... H03H 2003/028; H03H 9/02118; H03H 9/02; H03H 9/0211; H03H 9/02157; H03H 9/174; H03H 2003/023; H03H 2009/02173
See application file for complete search history.

(56) References Cited

U.S. PATENT DOCUMENTS

| | | |
|---|---|---|
| 2013/0033337 A1 | 2/2013 | Nishihara et al. |
| 2014/0118088 A1 | 5/2014 | Burak et al. |
| 2014/0176261 A1 | 6/2014 | Burak et al. |
| 2017/0237409 A1 | 8/2017 | Han et al. |
| 2020/0083861 A1 | 3/2020 | Matsuo et al. |

FOREIGN PATENT DOCUMENTS

| | | | | |
|---|---|---|---|---|
| CN | 103290367 A | | 9/2013 | |
| CN | 106698518 A | | 5/2017 | |
| CN | 103780219 B | * | 10/2017 | ......... H03H 9/02118 |
| CN | 109217842 A | | 1/2019 | |
| CN | 109361373 A | | 2/2019 | |
| CN | 109546985 A | | 3/2019 | |
| CN | 111200414 A | | 5/2020 | |
| CN | 111294010 A | | 6/2020 | |
| DE | 112009000947 T5 | | 9/2011 | |
| JP | 2017147719 A | | 8/2017 | |
| WO | 2008078649 A1 | | 7/2008 | |
| WO | 2009132011 A2 | | 10/2009 | |

OTHER PUBLICATIONS

Office Action issued in counterpart Japanese Patent Application No. 2023-517369 on Oct. 16, 2023.
Search Report issued in counterpart Application No. 20954686.0 on Jul. 15, 2024.

* cited by examiner

MANUFACTURING PROCESS FOR BULK ACOUSTIC RESONATOR, AND BULK ACOUSTIC RESONATOR

CROSS-REFERENCE TO RELATED PATENT APPLICATIONS

This application is the national phase of International Application No. PCT/CN2020/118175, titled "MANUFACTURING PROCESS FOR BULK ACOUSTIC RESONATOR, AND BULK ACOUSTIC RESONATOR", filed on Sep. 27, 2020, which claims the priority to Chinese Patent Application No. 202011024256.8 titled "MANUFACTURING PROCESS FOR BULK ACOUSTIC RESONATOR, AND BULK ACOUSTIC RESONATOR", filed on Sep. 25, 2020 with the China National Intellectual Property Administration, both of which are incorporated herein by reference in their entireties.

FIELD

The present disclosure relates to the technical field of communication devices, and in particular, to a manufacturing process for a bulk acoustic resonator, and a bulk acoustic resonator.

BACKGROUND

With the increasingly crowded electromagnetic spectrum and the increasing frequency bands and functions of wireless communication devices, the electromagnetic spectrum used in wireless communication is grown rapidly from 500 MHz to more than 5 GHz, and a demand for a radio frequency front-end module with high performance, low cost, low power consumption and small volume is increasing. As the radio frequency front-end module, a filter is used to improve quality of a transmission signal and a reception signal, and is mainly formed by multiple resonators connected to each other in a topological network structure. BAW (Bulk Acoustic Wave) resonator is a bulk acoustic resonator. A filter including the BAW resonator, due to advantages of a small size, strong integration ability, a high quality factor and strong power tolerance at a high frequency, serves as a core device of the radio frequency front-end module.

FBAR (Thin Film Bulk Acoustic Resonator) is a basic structure including an upper electrode, a lower electrode, and a piezoelectric layer sandwiched between the upper electrode and the lower electrode. The piezoelectric layer mainly realizes conversion between electrical energy and mechanical energy. In a case that an electric field is applied between the upper electrode and the lower electrode of the FBAR, the piezoelectric layer converts electrical energy into mechanical energy in a form of acoustic waves. There are two vibration modes of acoustic waves, including: a transverse wave mode and a longitudinal wave mode. The Longitudinal wave mode is a main mode of the FBAR in a working state. The bottom electrode crosses above an upper part of a cavity to ensure mechanical stability of the resonator. In a case that the electrodes are connected to other resonator or an introduced signal source, the electrodes are required to extend for an enough length to ensure normal transmission of an electrical signal. In this case, the top electrode and the bottom electrode extending outside an effective working region form an electric field under an external signal source to excite the piezoelectric layer between the top electrode and the bottom electrode to generate mechanical waves, so as to cause parasitic oscillation, which directly affects a frequency response of the resonator, thereby further causing deterioration of device performance such as instable waveform in a passband of the filter. Therefore, structure design of resonators becomes a difficult problem.

In a structure of a resonator in conventional technology, interaction between an upper electrode and a lower electrode is generally isolated through an air gap at a boundary of a cavity, so as to suppress parasitic oscillation and harmonic interference outside an effective region. The air gap is made by releasing a sacrificial layer inside the air gap. It is required to ensure mechanical stability of a part of the top electrode suspended above the piezoelectric layer. Films of the top electrode are stacked on the piezoelectric layer. Considering mechanical stability of the top electrode, especially very thin (100 nm) thickness of the electrodes and the piezoelectric layer at a high frequency band, stress control and mechanical stability becomes very challenging. Alternatively, a staggered electrode structure is used to avoid parasitic interference between the upper electrode and the lower electrode. The simply staggered electrode structure is attached to the air gap structure on the substrate. Formation of the above air gap requires a complex process. A side of the cavity is very steep. Growth of the electrodes and the piezoelectric layers on the steep side of the cavity causes serious stress and/or film defects, which affects device performance. Alternatively, a mass load at the top forms an acoustic impedance mutation region to suppress transverse waves to take away energy, thereby improving a Q factor. However, the piezoelectric layer above the edge of the cavity duplicates lattice defects and micro-pores caused by etching the bottom electrode, thereby affecting the device performance. Alternatively, a groove is made on the piezoelectric layer to form an acoustic impedance mutation region to suppress transverse waves to take away energy, thereby improving a Q factor. The groove is made by etching a notch on the piezoelectric layer. The etching process causes lattice defects and micro-pores of the piezoelectric layer at a bottom and a side wall of the groove. Even quality of films of the piezoelectric layer around the groove is affected to varying degrees. A stress distribution of an original ALN film is damaged, and a stress change is difficult to be controlled, which worsens the performance of the resonator. In addition, reduction of an area of a resonance region above the cavity increases a size of the filter to a certain extent. Although other staggered electrode structure avoids parasitic interference between the upper electrode and the lower electrode, it is easy to cause energy leakage, resulting in a very low Q factor.

SUMMARY

In view of the above technical problems in conventional technology, a manufacturing process of a bulk acoustic resonator and a bulk acoustic resonator are provided according to the present disclosure.

According to a first aspect of the present disclosure, a manufacturing process for a bulk acoustic resonator is provided. The manufacturing process includes:
  step S1: making an acoustic mirror on a substrate;
  step S2: making, on the substrate, a bottom electrode layer for covering the acoustic mirror;
  step S3: performing chemical treatment on a peripheral part of the bottom electrode layer to form a modified layer, where the modified layer surrounds the bottom electrode layer;

step S4: making a piezoelectric layer on the bottom electrode layer; and step S5: making a top electrode layer on the piezoelectric layer.

In specific embodiments, the bottom electrode is made of a metal and/or an alloy material. The bottom electrode is made of the metal and/or the alloy material (for example, Mo) to facilitate chemical treatment, so as to generate a semiconductor with high resistance or an insulating compound (for example, $MoS_2$).

In specific embodiments, the modified layer is firmed by performing local chemical treatment on the peripheral part of the bottom electrode layer. An acoustic impedance mutation region formed by local chemical treatment weakens intensity of an electric field in a non-elective working region, to suppress parasitic oscillation.

In specific embodiments, the modified layer is formed by performing total chemical treatment on the peripheral part of the bottom electrode layer. An acoustic impedance mutation region formed by total chemical treatment eliminates intensity of an electric field in a non-effective working region, to suppress parasitic oscillation.

In specific embodiments, in step S4, the piezoelectric layer at least covers the modified layer, and an amorphous crystal structure is formed above the modified layer. Acoustic impedance mutation is further formed with the amorphous crystal structure, reducing acoustic energy loss and a stray signal, and suppressing parasitic oscillation.

In specific embodiments, the acoustic mirror includes a cavity or a Bragg reflector structure. Different acoustic mirror structures achieve different acoustic reflection effects.

In specific embodiments, the chemical treatment includes vulcanization treatment, and the step S2 includes:

step S21: making a patterned hard mask on the bottom electrode layer to expose the bottom electrode in a to-be-vulcanized region;

step S22: putting a wafer with the patterned hard mask into a reaction furnace, introducing a mixed gas composed of oxygen, nitrogen and hydrogen sulfide, where a temperature maintains to be within a range from 700 degrees Celsius to 800 degrees Celsius to realize vulcanization reaction; and step S23: removing the patterned hard mask.

Vulcanization treatment is performed on a specific region on the bottom electrode layer to form the modified layer with acoustic impedance mutation with step S23.

In specific embodiments, step S23 further includes:

putting the wafer with the patterned hard mask into the reaction furnace, introducing oxygen to realize oxidation, introducing an inert gas as a carrier, and introducing sulfur powder as a precursor, where the temperature maintains to be within a range from 600 degrees Celsius to 700 degrees Celsius to realize the vulcanization reaction, In the above two different vulcanization processes, a thickness of a vulcanization layer may be adjusted by controlling different parameters to obtain bulk acoustic resonators with different properties.

According to a second aspect of the present disclosure, a bulk acoustic resonator is provide. The bulk acoustic resonator includes a substrate, an acoustic mirror formed on the substrate, and a bottom electrode layer, a piezoelectric layer and a top electrode layer that are sequentially formed on the substrate with the acoustic mirror. Chemical treatment is performed on a part of the bottom electrode layer close to an edge of the acoustic mirror to form a modified layer. The modified layer formed by chemical treatment on the bottom electrode layer forms an acoustic impedance mutation region, which effectively reflects transverse waves and weakens intensity of an electric field outside an effective region, thereby suppressing parasitic oscillation and improving performance of the bulk acoustic resonator.

In specific embodiments, the piezoelectric layer is made after formation of the modified layer and at least covers the modified layer, and an amorphous crystal structure is formed above the modified layer. Acoustic impedance mutation is further formed with the amorphous crystal structure, reducing a stray signal, and suppressing parasitic oscillation.

In specific embodiments, local chemical treatment is performed on the part of the bottom electrode layer close to the edge of the acoustic mirror to form the modified layer. An acoustic impedance mutation region formed by local chemical treatment weakens intensity of an electric field in a non-effective working region, to suppress parasitic oscillation.

In specific embodiments, total chemical treatment is performed on the part of the bottom electrode layer close to the edge of the acoustic mirror to form the modified layer. An acoustic impedance mutation region formed by total chemical treatment eliminates intensity, of an electric field in a non-effective working region, to suppress parasitic oscillation.

In specific embodiments, a surface of the modified layer is slightly higher than the bottom electrode layer without chemical treatment. The modified layer is slightly higher than the electrode layer without chemical treatment, so as to reflect the transverse waves well.

In specific embodiments, the acoustic mirror includes a cavity or a Bragg reflector structure. Different acoustic mirror structures achieve different acoustic reflection effects.

In specific embodiments, the chemical treatment includes vulcanization treatment. The vulcanized modified layer surrounds a peripheral part of the bottom electrode layer. The bottom electrode is made of a metal and/or an alloy material. The bottom electrode is made of the metal and/or the alloy material (for example, Mo) to facilitate chemical treatment, so as to generate a semiconductor with high resistance or an insulating compound (for example, $MoS_2$). In this way, the modified layer is formed in a non-working region at the edge of the bottom electrode layer to realize acoustic impedance mutation, thereby suppressing parasitic oscillation.

In the present disclosure, a semiconductor with low conductivity (high resistance) or an insulating compound such as $MoS_2$ is synthesized by chemical means such as vulcanization treatment performed on a part or all of an end of the metal bottom electrode such as Mo outside the effective working region, so that the non-effective working region adjacent to the effective working region forms the modified layer of the acoustic impedance mutation region to suppress the parasitic oscillation outside the effective working region, thereby improving the device performance. A lattice of the modified layer and a lattice of the piezoelectric layer are mismatched due to a large difference in crystal surface index and atomic spacing. Piezoelectric layer thin films with amorphous morphology or poor C-axis orientation are grown on an interface above the modified layer outside the effective working region, which further suppresses the parasitic oscillation outside the effective working region. The bulk acoustic wave resonator of this structure weakens or eliminates the intensity of the electric field between the electrodes outside the effective working region. The electrodes cannot excite the piezoelectric layer between the electrodes to generate mechanical waves, thereby suppressing the parasitic oscillation of the resonator. The top electrode can be directly led out from the top of the resonator, greatly simplifying the wiring of the top electrode.

BRIEF DESCRIPTION OF THE DRAWINGS

Drawings are included to provide a further understanding of the embodiments. The drawings are incorporated into the specification and form part of the specification. The drawings illustrate the embodiments and are used to explain the principle of the present disclosure together with the description. It will be easy to note other embodiments and many expected advantages of the embodiments. The embodiments will be better understood by referring to the following detailed description. The elements in the drawings are not necessarily proportional to each other. The same reference numerals represent corresponding similar parts.

DETAILED DESCRIPTION OF EMBODIMENTS

The present disclosure is described in detail below in conjunction with drawings and embodiments. It should be understood that the embodiments described here are used to explain the present disclosure, but not to limit the present disclosure. It also should be noted that for easy of description, the drawings merely show partial structures related to the present disclosure.

It should be noted that, the embodiments in the present disclosure and features in the embodiments may be in combination with each other as long as there is no conflict.

Figure 1:
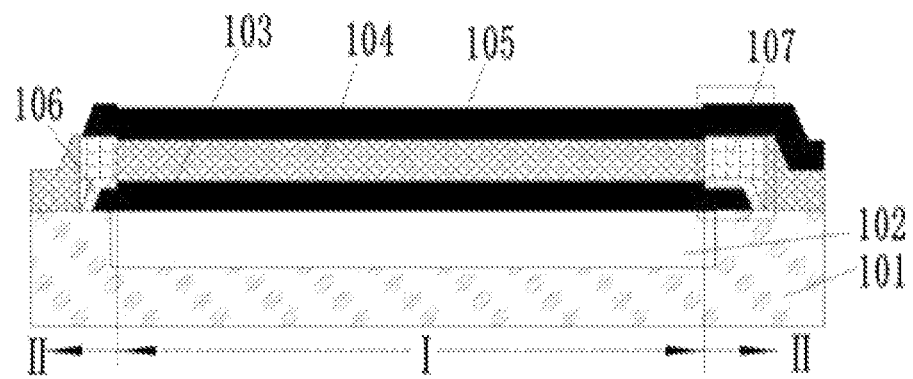
FIG. 1 is a schematic cross-sectional view of a bulk acoustic resonator according to an embodiment of the present disclosure.

FIG. 1 is a schematic cross-sectional view of a bulk acoustic resonator according to an embodiment of the present disclosure. As shown in FIG. 1, the bulk acoustic resonator includes a substrate 101, an acoustic mirror 102, a bottom electrode 103, a piezoelectric layer 104, a top electrode 105, a bottom electrode modified layer 106 and an acoustic impedance mutation region 107. The acoustic mirror 102 is formed on the substrate 101. The bottom electrode 103, the piezoelectric layer 104 and the top electrode 105 are sequentially formed on the acoustic mirror 102. A position where projections of un-chemically treated bottom electrode 103, piezoelectric layer 104 and acoustic mirror 102 in the bulk acoustic resonator in a vertical direction overlap forms an effective working region I, and the other regions forms a non-working region II. The bottom electrode modified layer 106 is a semiconductor or an insulating compound formed by performing chemical treatment on the bottom electrode 103. In an embodiment, the chemical treatment may be vulcanization treatment. It should be noted that the bottom electrode modified layer 106 may be formed by other chemical treatment, as long as the treated bottom electrode 103 forms a semiconductor or an insulating compound. The vulcanization treatment is taken as an example in the subsequent embodiments.

In specific embodiments, the bottom electrode 103 is made of a metal and/or an alloy material. In this embodiment, the bottom electrode is preferably made of Mo. Vulcanization treatment is performed on an end of the bottom electrode 103 outside the effective working region I to form the bottom electrode modified layer 106. The bottom electrode modified layer 106 is a poor conductor $MoS_2$ with high resistance. A thickness of the bottom electrode modified layer 106 may be controlled according to a process of the vulcanization treatment, so that part or all of Mo at the end of the bottom electrode 103 outside the effective working region I are chemically synthesized into $MoS_2$. The thickness of the bottom electrode modified layer 106 may be set in a customized manner according to requirements for performance of the bulk acoustic resonator to achieve an effect of suppressing parasitic oscillation to different degrees, so as to weaken or eliminate the intensity of the electric field to different degrees, thereby achieving different degrees of suppression effect. The bottom electrode 103 outside the effective working region I is locally or totally vulcanized, and the bottom electrode modified layer 106 outside the effective working region I forms an acoustic impedance mutation region to reflect transverse waves, so as to weaken (in a case of local modification) or eliminate (in a case of total modification) the intensity of the electric field and suppress parasitic oscillation. The bottom electrode modified layer 106 isolates the top electrode 105, the piezoelectric layer 104 and the bottom electrode 103 in the non-effective working region II of the resonator, which inhibits parasitic oscillation between the three layer of structures, thereby greatly reducing a stray signal and energy loss. It should be noted that the bottom electrode 103 may be made of other metals such as Cu, Au, Ag, Pt, and Ru in addition to Mo, which also achieves the technical effect of the present disclosure.

In specific embodiments, the bottom electrode modified layer 106 subjected to vulcanization treatment forms an acoustic impedance mutation region 107. Transverse waves can be reflected to the effective working region I in the acoustic impedance mutation region 107, avoiding reducing a Q factor of the resonator due to energy attenuation. A projection of the acoustic impedance mutation region 107 above the substrate 101 in the vertical direction at least coincides with a boundary of the acoustic mirror 102. Alternatively, a part of the projection is inside the acoustic mirror 102 and the other part of the projection is on the substrate. This structure is applicable to a resonator with an SMR-BAW (Solidly Mounted Resonator-Bulk Acoustic Wave Device) structure.

Figure 2:
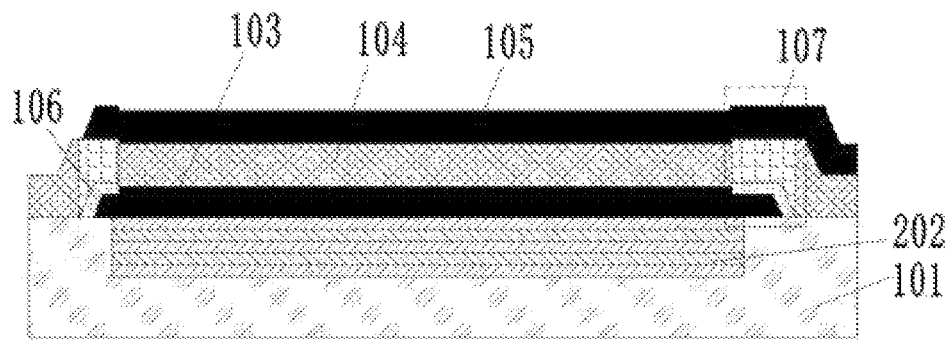
FIG. 2 is a schematic cross-sectional view of a bulk acoustic resonator according to an embodiment of the present disclosure.

Although the acoustic mirror 102 shown in FIG. 1 is a cavity structure on the substrate 101, it should be noted that the acoustic mirror 102 may also be a Bragg reflector structure 202 formed by processing on the substrate 101 as shown in FIG. 2. The Bragg reflector structure 202 is formed by stacking a film layer with high acoustic impedance and a film layer with low acoustic impedance alternatively. Other structures are consistent with those shown in FIG. 1, which are not repeated here, and the technical effect of the present disclosure can also be achieved.

Compared with the structure of the bulk acoustic resonator according to conventional technology, in the bulk acoustic resonator according to the present disclosure, the bottom electrode 103 outside the effective region I is directly chemically synthesized into a poor conductor to realize isolation between the electrodes. Thin films of the top electrode 105 are stacked on the piezoelectric layer 104 and it is not required to consider mechanical stability of the top electrode. Especially in a high frequency band, thicknesses of the electrodes and the piezoelectric layer are very thin (100 nm), it is easier to control the stress and mechanical stability in the present disclosure compared with conventional technology. An influence caused by stress and/or film defects due to parasitic interference is eliminated. Compared with conventional technology, quality of thin films of the piezoelectric layer is not damaged, and a device size is not affected. In addition, the top electrode 105 of the bulk acoustic resonator with this structure can be directly led out from the top of the resonator, which greatly facilitates the wiring of the top electrode 105.

Figure 3A:
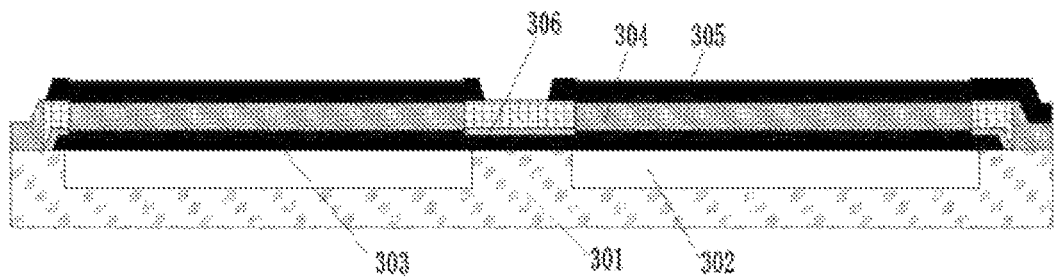
FIG. 3a to FIG. 3c are schematic cross-sectional views of bulk acoustic resonators in parallel and bulk acoustic resonators in series according to an embodiment of the present disclosure.
Figure 3B:
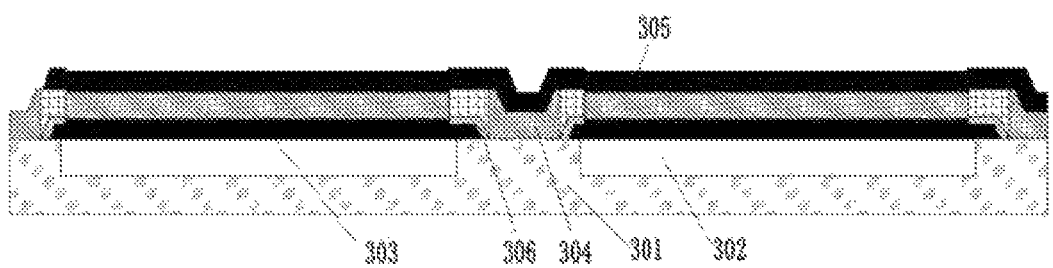
Figure 3C:
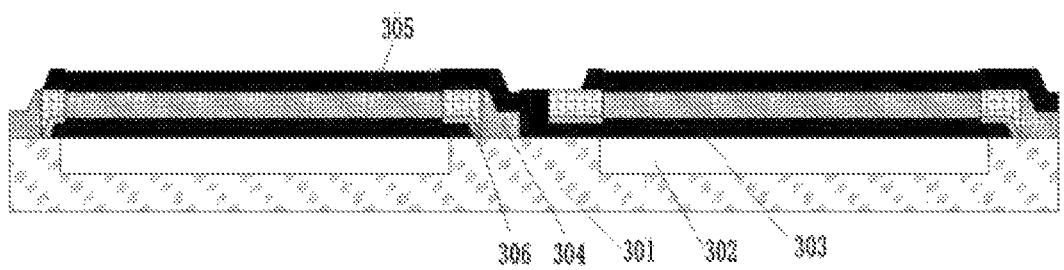

Referring to FIG. 3a to FIG. 3c, which are schematic cross-sectional views of bulk acoustic resonators in parallel and bulk acoustic resonators in series according to an embodiment of the present disclosure. FIG. 3a is a schematic cross-sectional view of bulk acoustic resonators connected in parallel through bottom electrodes. As shown in FIG. 3a, in a case that two resonators are connected in parallel through bottom electrodes 303, a projection of modified layers 306 at a connection covers a part of the substrate 301 between the resonators in parallel, and the projection of the modified layer 306 falls into an interior of two cavities 302 or coincides with a boundary of the two cavities 302. Compared with conventional technology, the parallel structure effectively suppresses parasitism caused by connection between the bottom electrodes and reduces a stray signal and acoustic energy loss, which is difficult to achieve in conventional technology, FIG. 3b is a schematic cross-sectional view of hulk acoustic resonators in parallel through top electrodes 305. As shown in FIG. 3b, in a case that the two resonators are connected in parallel through the top electrodes 305, the piezoelectric layers 304 are isolated from the two bottom electrodes 303 by the modified layer 306, which suppresses parasitic loss, thereby improving performance of the resonator. FIG. 3c is a schematic cross-sectional view of bulk acoustic resonators in series. The top electrode 305 of a first resonator is connected with the bottom electrode 303 of a second resonator. It should be noted that a region of the electrode of the first resonator in which the two resonators are connected and a region of the electrode of the second resonator in which the two resonators are connected cannot be isolated by the modified layer 306, otherwise a feature of high resistance of the modified layer 306 will greatly attenuate an electrical signal to reduce a Q factor of a device.

FIG. 4a to FIG. 4k are schematic programs showing a manufacturing process for a bulk acoustic resonator according to an embodiment of the present disclosure. The process includes the following steps.

Figure 4A:
FIG. 4a to FIG. 4k are schematic programs showing a manufacturing process for a bulk acoustic resonator according to an embodiment of the present disclosure.
Figure 4B:
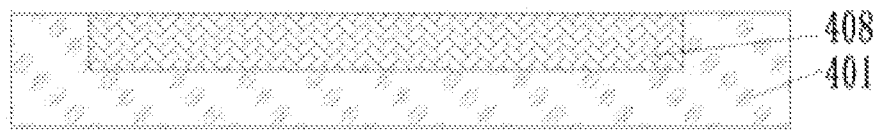

First, as shown in FIG. 4a and FIG. 4b, a cavity 402 is made on a substrate 401 by photolithography or etching. A sacrificial layer 408 is grown in the cavity 402 by a PVD (Physical Vapor Deposition) process, and then the substrate 401 is flush with the sacrificial layer 408 by a chemical-mechanical polishing process. The substrate 401 may be made of a material such as Si, SiC, sapphire or spinel. The sacrificial layer 408 is made of PSG (P doped $SiO_2$). In an embodiment, a thickness of the sacrificial layer subjected to chemical-mechanical polishing process (i.e. a height of the cavity after Rlease) ranges from 1 um to 2 um.

Figure 4C:
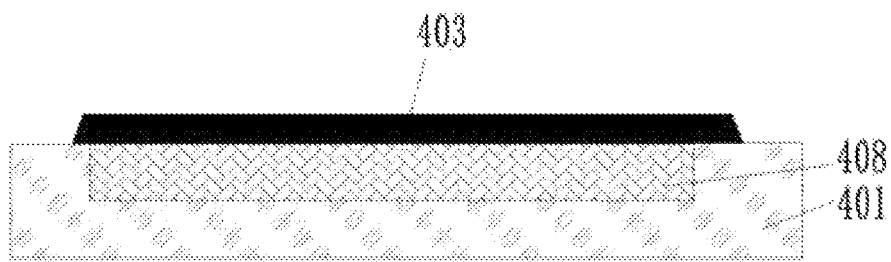
Figure 4D:
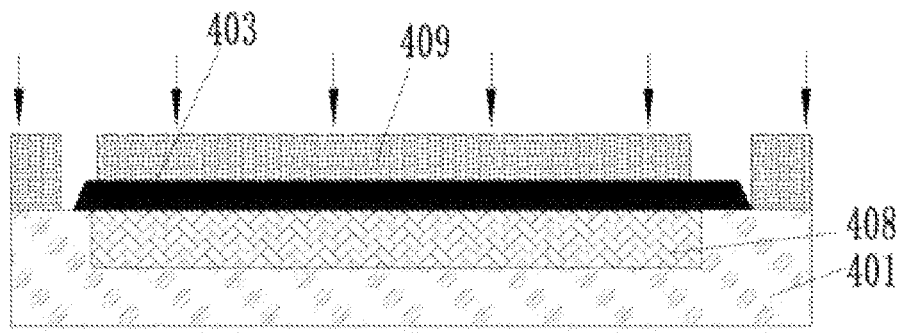

As shown in FIG. 4c, a required patterned bottom electrode 403 is processed on the substrate 401 and the sacrificial layer 408. The bottom electrode 403 may be made of a metal such as Mo, Cu, Au, Ag, Pt or Ru. In an embodiment, the bottom electrode 403 is made of Mo. $MoS_2$ with high resistance can be generated during vulcanization treatment in a case that the bottom electrode 403 is made of Mo. Then vulcanization treatment is performed on the bottom electrode 403. Specifically, a patterned hard mask 409 is made on the bottom electrode 403. The hard mask 409 is made of $SiO_2$, a part of the bottom electrode 403 in a to-be-vulcanized region is exposed, as shown in FIG. 4d.

In specific embodiments, vulcanization treatment may be performed on the bottom electrode 403 by using the following two processes. A wafer with a patterned hard mask is put into a vapor deposition furnace or a tubular furnace, a mixed gas of $H_2$, $N_2$ and $H_2S$ is introduced, and a temperature is controlled to maintain about 750 degrees Celsius (within a range from 700 degrees Celsius to 800 degrees Celsius), to obtain a $MoS_2$ film finally. Alternatively, a wafer with a patterned hard mask is put into a vapor deposition furnace or a tubular furnace, $O_2$ is introduced to oxidize the exposed bottom electrode made of Mo, an inert gas such as Ar is introduced as a carrier, sulfur powder is introduced as a precursor, and a temperature is controlled to maintain about 650 degrees Celsius (within a range from 600 degrees Celsius to 700 degrees Celsius), to obtain a $MoS_2$ film finally.

Figure 4E:
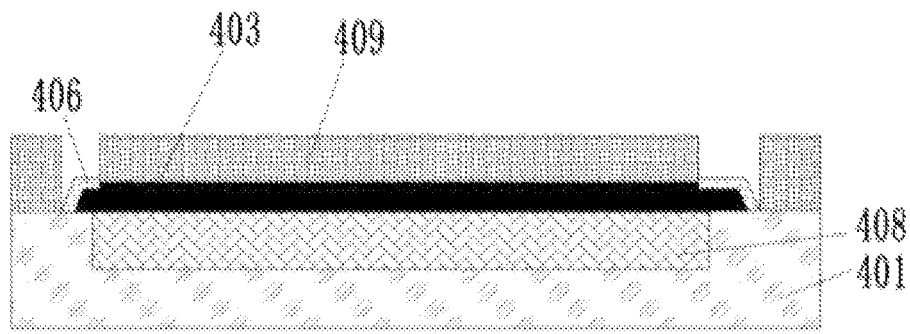
Figure 4F:
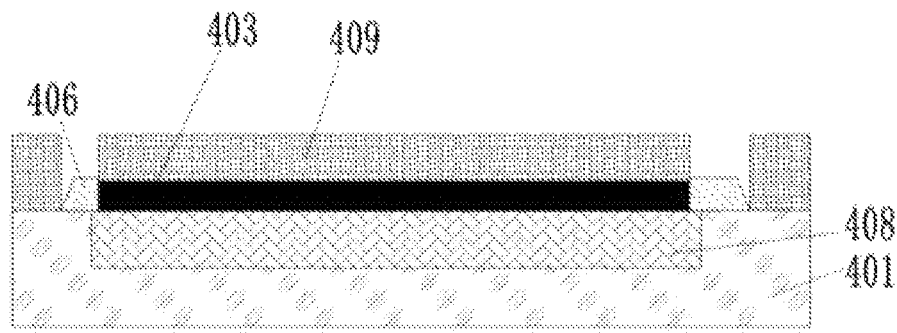

In specific embodiments, by using the above two processes, vulcanization treatment is performed on a part of the region in the bottom electrode 403, so that part of Mo and S are combined to form the modified layer 406 made of $MoS_2$. In an embodiment, a thickness of the final modified layer 406 made of $MoS_2$ may be adjusted by adjusting parameters such as a gas ratio, a gas flow, a temperature, and power in the processes. Specifically, an appropriate parameter may be adjusted according to device performance required in actual conditions. The modified layer 406 subjected to vulcanization treatment is slightly higher than the bottom electrode 403 without vulcanization treatment. A height difference between the modified layer 406 and the bottom electrode 403 is within a range from 0 nm to 100 nm. The height difference is formed. FIG. 4e shows that local vulcanization treatment is performed on the exposed bottom electrode 403 to form the modified layer 406 with a certain thickness. The thickness may be adjusted according to the above processes. An acoustic impedance mutation feature of the modified layer 406 causes reflection of the transverse waves. The modified layer 406 with different thicknesses can weaken the intensity of the electric field to different degrees, so as to suppress parasitic oscillation. FIG. 4f shows that total vulcanization treatment is performed on the exposed bottom electrode 403 to form the modified layer 406. The acoustic impedance mutation feature of the modified layer 406 causes reflection of the transverse waves. The modified layer 406 subjected to total vulcanization treatment can eliminate the intensity of the electric field, so as to suppress the parasitic oscillation.

Figure 4G:
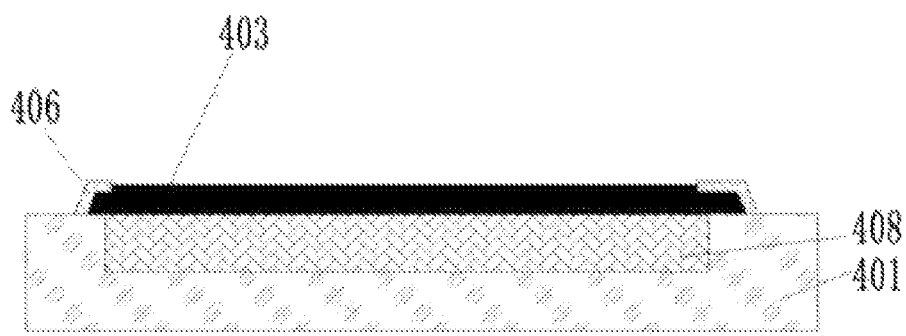
Figure 4H:
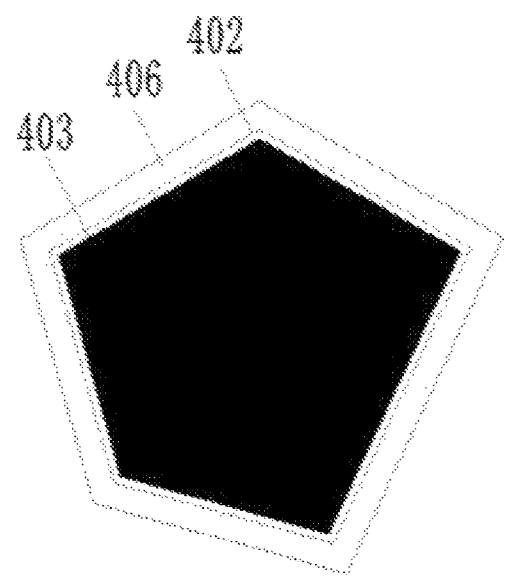

Refer to FIG. 4g, the hard mask 409 is removed. Specifically, the hard mask 409 may be removed by using hydrofluoric acid etchant. As shown in the top view in FIG. 4h, vulcanization treatment is performed on at least one side of the bottom electrode 403. A projection of the bottom electrode 403 inside the cavity 402 or coincides with a boundary of the cavity 402. The modified layer 406 subjected to vulcanization treatment surrounds an end of the bottom electrode 403 to form an acoustic impedance mutation region for reflecting transverse waves, so as to weaken or eliminate the intensity of the electric field outside the effective region, thereby suppressing parasitic oscillation.

Figure 4I:
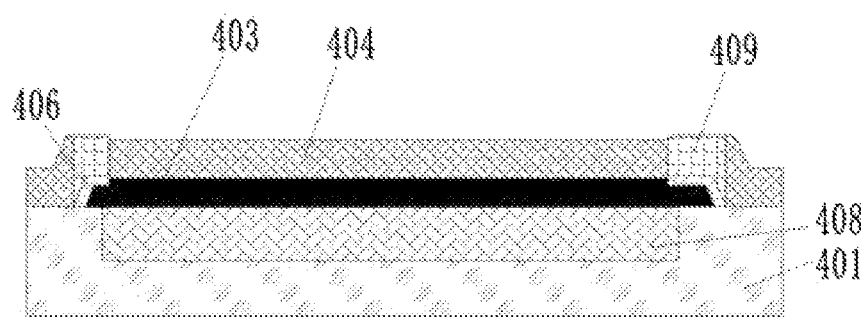
Figure 4J:
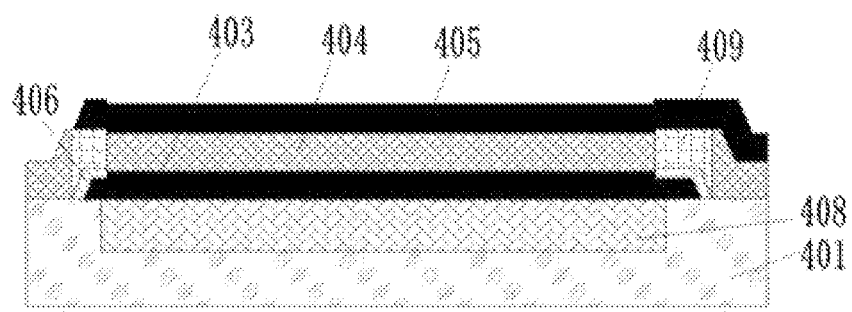
Figure 4K:
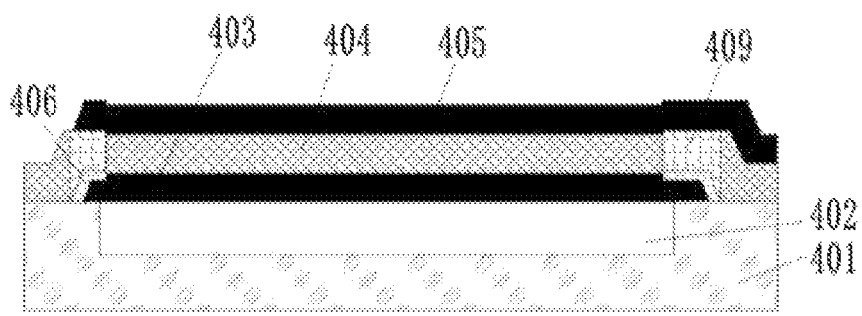

As shown in FIG. 4i, the piezoelectric layer 404 is made on the basis of the above. The piezoelectric layer 404 may be an ALN film. A lattice of the $MoS_2$ of the modified layer 406 and a lattice of the ALN of the piezoelectric layer 404 are mismatched due to a large difference in crystal plane index and atomic spacing, resulting in growth of an AlN film 409 with poor C-axis orientation and amorphous morphology on an $MoS_2$ interface outside the effective working region. As shown in FIG. 4j, a top electrode 405 is made on the piezoelectric layer 404 and the amorphous AlN film 409, and patterned process is performed. The top electrode 405 on an upper surface of the AlN film 409 with poor C-axis orientation and amorphous morphology and the bottom electrode 403 on a lower surface of AlN film 409 with poor C-axis orientation and amorphous morphology are difficult to excite the piezoelectric layer 404 between the top electrode and the bottom electrode to generate mechanical waves, so that acoustic impedance mutation is further formed, which reduces acoustic energy loss and a stray signal, thereby greatly suppressing parasitic oscillation. Finally, the sacrificial layer 408 is released using hydrofluoric acid etchant to obtain the cavity 402 (as shown in FIG. 4k) and the manufacturing process of a bulk acoustic resonator is completed.

The modified layer 406 is formed in the non-working region at the edge of the bottom electrode 403 through vulcanization treatment by using the above process to achieve acoustic impedance mutation and suppress parasitic oscillation. The thickness of the modified layer 406 may be adjusted according to different requirements for device performance to weaken or eliminate the intensity of the electric field, thereby suppressing parasitic oscillation. In addition, above the modified layer 406, the amorphous crystal structure is formed caused by lattice mismatch between the $MoS_2$ of the modified layer 406 and the ALN of the piezoelectric layer 404, so that acoustic impedance mutation is further formed, which reduces acoustic energy loss and a stray signal, thereby suppressing parasitic oscillation.

The above process is not only applicable to manufacture of bulk acoustic resonators, but also be applicable to BAW (Bulk Acoustic Wave) filters with any structure and mode used in a wireless communication device (a terminal scenario such as a 2G, 3G, 4G, or 5G mobile phone, Wi-Fi, a Pad, a smart watch, IOT (Internet of Things), a cars, and a GPS) and radio frequency, including FBAR (Thin Film Bulk Acoustic Resonator), SMR-BAW (Solidly Mounted Resonator-Bulk Acoustic Wave Device), CRF (Coupled Resonator Filter), SCF (Stacked Crystal Filter), SBAR (Stacked Bulk Acoustic Resonator), RBAR (Reverse Bulk Acoustic Resonator), DBAR (Dual Bulk Acoustic Resonator) or the like. The above process is also applicable to all types of mems devices such as an SAW (Surface Acoustic Wave) resonator, a piezoelectric device or a sensor made of any piezoelectric material including ZnO, PZT, lithium carbonate LN, lithium niobate LT or the like.

The specific embodiments of the present disclosure are described above. However, the protection scope of the present disclosure is not limited to the embodiments. Any technical personnel familiar with the technical field can easily think of variations or replacements within the scope of technology disclosed in the present disclosure, and the variations and replacements should be covered in the protection scope of the present disclosure. Therefore, the protection scope of the present disclosure should be subject to the protection scope of the claims.

In the description of the present disclosure, it is required to understand that the an orientation or position relationship indicated by the terms "up", "down", "inside", "outside", etc. is based on an orientation or position relationship shown in the drawings. The terms are only for convenience of describing the present disclosure and simplifying the description, but not for indicating or implying that a device or element referred to is required to have a specific orientation, be constructed and operated in a specific orientation, so that the terms cannot be understood as a limitation of the present disclosure. The wording 'including' does not exclude existence of an element or a step not listed in the claims. The wording 'a' or 'one' in front of an element does not exclude the existence of multiple such elements. A simple fact that some measures are recorded in different dependent claims does not mean that a combination of these measures cannot be used for improvement. Any reference symbol in the claims should not be interpreted as limiting the scope.

The invention claimed is:

1. A manufacturing process method for a bulk acoustic resonator, comprising:
    step S1: making an acoustic mirror on a substrate;
    step S2: making, on the substrate, a bottom electrode layer for covering the acoustic mirror;
    step S3: performing chemical treatment on a peripheral part of the bottom electrode layer to form a modified layer, wherein the modified layer surrounds the bottom electrode layer;
    step S4: making a piezoelectric layer on the bottom electrode layer; and
    step S5: making a top electrode layer on the piezoelectric layer,
    wherein the modified layer is formed by performing at least local chemical treatment on the peripheral part of the bottom electrode layer.

2. The manufacturing process method according to claim 1, wherein the bottom electrode is made of a metal and/or an alloy material.

3. The manufacturing process method according to claim 1, wherein the modified layer is formed by performing total chemical treatment on the peripheral part of the bottom electrode layer.

4. The manufacturing process method according to claim 1, wherein in step S4, the piezoelectric layer at least covers the modified layer, and an amorphous crystal structure is formed above the modified layer.

5. The manufacturing process method according to claim 1, wherein the acoustic mirror comprises a cavity or a Bragg reflector structure.

6. The manufacturing process method according to claim 1, wherein the chemical treatment comprises vulcanization treatment, and the step S3 comprises:
    step S21: making a patterned hard mask on the bottom electrode layer to expose the bottom electrode in a to-be-vulcanized region;
    step S22: putting a wafer with the patterned hard mask into a reaction furnace, introducing a mixed gas composed of oxygen, nitrogen and hydrogen sulfide, wherein a temperature maintains to be within a range from 700 degrees Celsius to 800 degrees Celsius to realize vulcanization reaction; and
    step S23: removing the patterned hard mask.

7. The manufacturing process method according to claim 6, wherein the step S22 comprises:
    putting the wafer with the patterned hard mask into the reaction furnace, introducing oxygen to realize oxidation, introducing an inert gas as a carrier, and introducing sulfur powder as a precursor, wherein the temperature maintains to be within a range from 600 degrees Celsius to 700 degrees Celsius to realize the vulcanization reaction.

8. A bulk acoustic resonator, comprising:
a substrate,
an acoustic mirror formed on the substrate; and
a bottom electrode layer, a piezoelectric layer and a top electrode layer that are sequentially formed on the substrate with the acoustic mirror;
wherein chemical treatment is performed on a part of the bottom electrode layer close to an edge of the acoustic mirror to form a modified layer, and the modified layer surrounds the bottom electrode layer,
wherein at least local chemical treatment is performed on the part of the bottom electrode layer close to the edge of the acoustic mirror to form the modified layer.

9. The bulk acoustic resonator according to claim 8, wherein the piezoelectric layer is made after formation of the modified layer and at least covers the modified layer, and an amorphous crystal structure is formed above the modified layer.

10. The bulk acoustic resonator according to claim 8, wherein total chemical treatment is performed on the part of the bottom electrode layer close to the edge of the acoustic mirror to form the modified layer.

11. The bulk acoustic resonator according to claim 8, wherein a surface of the modified layer is higher than the bottom electrode layer without chemical treatment.

12. The bulk acoustic resonator according to claim 8, wherein the acoustic mirror comprises a cavity or a Bragg reflector structure.

13. The bulk acoustic resonator according to claim 8, wherein:
the chemical treatment comprises vulcanization treatment;
the vulcanized modified layer surrounds a peripheral part of the bottom electrode layer; and
the bottom electrode is made of a metal and/or an alloy material.

* * * * *